Dec. 6, 1966 G. J. OVERTVELD 3,290,636

THIN-FILM CIRCUIT CONNECTOR

Filed Nov. 27, 1963 2 Sheets-Sheet 1

THIN-FILM CIRCUIT CONNECTOR

Filed Nov. 27, 1963 2 Sheets-Sheet 2

United States Patent Office 3,290,636
Patented Dec. 6, 1966

3,290,636
THIN-FILM CIRCUIT CONNECTOR
Gilles Jozias Overtveld, Ottawa, Ontario, Canada, assignor to Northern Electric Company Limited, Montreal, Quebec, Canada
Filed Nov. 27, 1963, Ser. No. 326,434
Claims priority, application Canada, Sept. 30, 1963, 885,639
9 Claims. (Cl. 339—17)

This invention relates to a connecting device and has particular reference to an apparatus for making contact to thin-film substrates.

The thin-film circuit is a recent development in the electronics art, in which a continuaus layer of tantalum nitride is deposited on glass or a ceramic material. The geometric pattern of the layer can be established by using a photo-etching process. Part of the layer is oxidized in areas, where resistivity is to be increased, to tantalum pentoxide; and in other areas where conductivity is to be increased, gold can be deposited again by a photo-etch process to create a conductor in that area. Gold is placed also in those areas where external electrical contact is to be made to the substrate. The result is a thin layer of several microns thickness forming a pattern which within these limits can be of any desired form of electrical network. Resistors as well as capacitors can be made up in this way and the technique represents a definite step forward in electronic circuit construction.

Certain problems arise, however, when it is necessary to make connection to such a thin-film circuit since the layers of gold are very thin and the substrate is brittle. While soldered connections can be made directly to the gold they do not appear to have very high strength and are fairly easily wrenched from the substrate. The weight of the components so soldered to the substrate can also cause breakage in the event of mechanical shock to the device. Since the components attached to the thin film may be quite large, such a film and substrate having to support these components may necessarily be larger than if it were not forming the support. Finally with components rigidly soldered to the thin film, their replacement is made quite difficult since the film may well be damaged while one component is unsoldered and a second one mounted in replacement.

It is important to bear in mind that the making of contact by a connector which will slide over the gold must be avoided because any of the generally used rugged forms of connector, which could be allowed to have their contacting portions exposed, will exert too much wiping action on the thin gold film and on the first or second connection and are likely completely to remove it from the area to which contact is intended to be made. If such connectors are made much more delicately so that the pressure they exert on the gold is sufficiently low, they are too liable to damage before being put into use.

In carrying out the teaching of the present invention, the difficulties mentioned above can be overcome and an effective easily detachable connection made to thin film circuits.

In describing the present invention reference will be made to the accompanying drawings in which.

Figure 1:
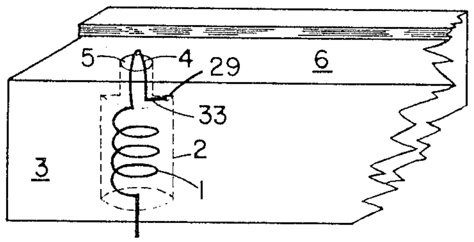
FIGURE 1 is a perspective view of part of a connector block.
Figure 2:
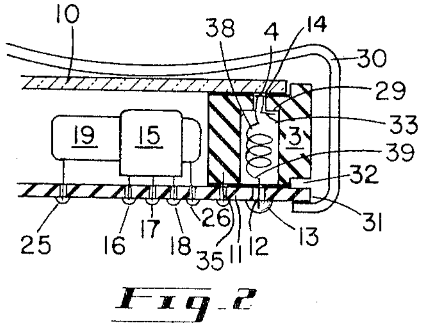
FIGURE 2 is a side sectional view of a circuit assembly embodying the teaching of the invention sectioned along line 2—2 of FIGURE 3.
Figure 3:
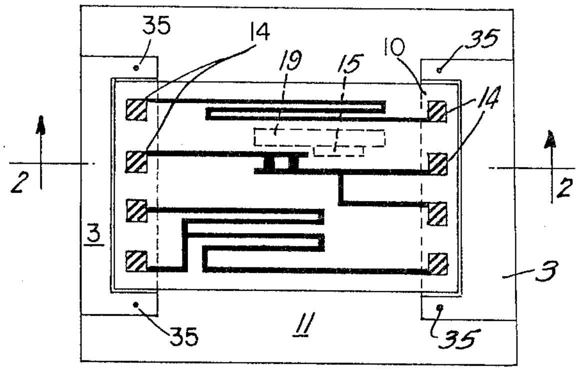
FIGURE 3 is a partial view from above of a circuit assembly embodying the teachings of the invention in which seven components have been omitted for clarity and in which the thin-film substrate is transparent.

In FIGURES 1, 2 and 3 a basic connector structure is shown in which a helically wound spring wire 1 contained within a cylindrical recess 2, in an insulating block 3, has a hairpin shaped connecting portion 4 protruding from a hole 5 in the block 3. The hole 5 is formed beneath a plateau section 6 of the block which receives the edge of the underface of a thin-film circuit carried on a substrate 10. The areas for contact 14 on the thin-film circuit are placed in such a position that each contacting surface will align with one of the hairpin sections 4.

The pressure which the hair pin will exert on the thin-film circuit is determined by the thickness of the wire of which the spring 1 is made, the pitch and the length of the coil into which it is wound and the distance through which the spring is compressed when lodged in recess 2. The distance through which the hairpin is displaced by the insertion of the circuit substrate will also determine this pressure, but the percentage variations in pressure will be smaller for small misalignments of the substrate, as the amount by which the spring is initially compressed in its recess is increased. Because the thin-film circuit is fragile, heavily-made spring wire cannot be used, but my mounting in the manner shown in FIGURE 1 only the small operative hairpin part protrudes where it could be damaged during assembly or maintenance, whereas the longer coil part of the spring is completely protected within the block 3. The spring can thus be delicate in construction and the hairpin part is effectively limited so that any accidental movement is in its proper direction of operation and therefore any damage to the spring is prevented. In FIGURE 2 the block 3 is shown mounted above a printed circuit board 11 and connections are brought from the springs at their protruding lower ends 12 through the printed circuit board and are soldered to it as shown at 13. As an example shown in FIGURE 2 a transistor 15 is mounted on the printed circuit board by soldering its leads to metallic conducting strips formed on the board in conventional manner at 16, 17 and 18 and a capacitor 19 is soldered at 25 and 26 to the same board. The means by which the various items are soldered to the circuit on the printed circuit board may follow conventional techniques and may for instance be accomplished by wave, dip or hand soldering. The thin-film substrate 10 which in this instance is also transparent is clamped down on the block 3 suitably by means of metal clips 30 which are caught underneath the edge 31 of the printed circuit board 11. Alternatively, the clip may be received in a recess 32 formed in the block 3 if desired. The block is prevented from sliding on the circuit board 11 by means of pins 35 passing through the block and soldered or mechanically fastened on to the board.

Figure 4:
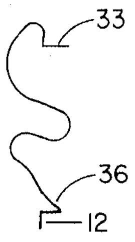
FIGURES 4 and 5 are side view of alternative spring members.
Figure 5:
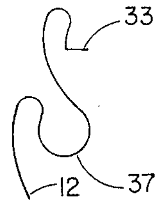

While the spring 1 shown in FIGURES 1 and 2 is helical; FIGURES 4 and 5 show other configurations for the spring. In all these springs a locating shoulder 33 is included to define the amount by which the projecting portion 4 extends above blocks 3 when in its fully extended position. Shoulder 33 engages against face 29 of recess 2 and allows the spring to be put under a predetermined compression in the recess, since end 12 is fixed to the board 11. A locating knee may also be formed at 36 so that the spring presses against the board before it is soldered. This accurate positioning of the spring ensures that the distance through which it is compressed when the thin-film circuit is inserted is known. In the spring of FIGURE 5, 37 forms a locating elbow with respect to board 11, and with the helical spring 1 the lower termination 39 of the helix might form such locating means. In some cases the shoulder 33 may be omitted and the upper termination 38 of the helix of spring 1 be used to fulfill its function instead.

Figure 6:
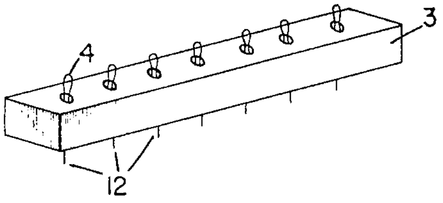
FIGURE 6 is a perspective view of a linear connector assembly.
Figure 7:
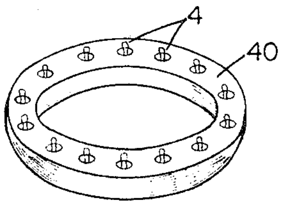
FIGURE 7 is a perspective view of an annular connector assembly.

FIGURE 6 shows one form of block 3 in which the spring contacts are all arranged in line with their hairpins 4 exposed and their lower contacts 12 depending beneath the block for connection into a printed circuit or other terminal board; FIGURE 7 shows an arrangement in which annular block 40 may co-operate with a thin-film substrate whose pattern of contacts 13 is circular, connection being made by the hairpin ends 4 protruding from the upper face of the block 40.

Figures 8, 9, 10, 12:
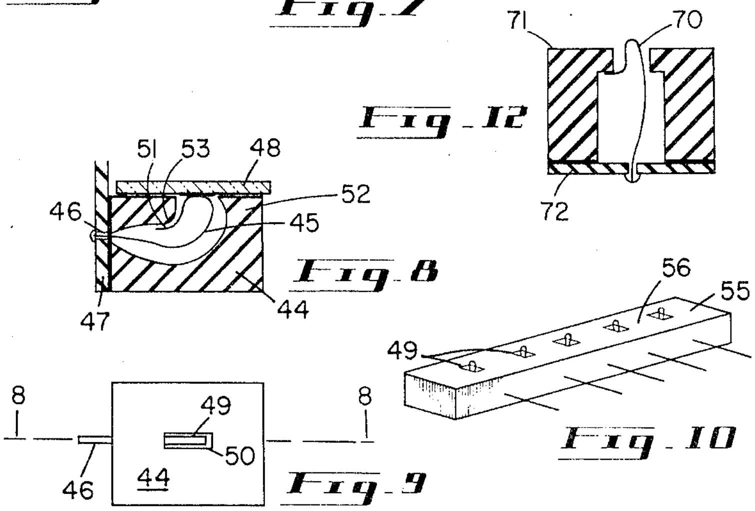
FIGURE 8 is a sectional view along line 8—8 of FIGURE 9.
FIGURE 9 is a plan view of an alternative connector.
FIGURE 10 is a perspective view of a block of connectors of FIGURE 9.
FIGURE 12 is a sectional view of another spring type.

In instances where high-frequency currents must be handled, the inductance of a helical spring 1 may be unsatisfactory and a configuration such as shown in FIGURES 8, 9 and 10 might be more suitable. Here the spring 45 is a simple cantilever being fastened at its end 46 for instance by soldering into a printed circuit or terminal board 47. In this case the thin-film substrate 48 is arranged perpendicularly to the circuit board. The spring includes a shoulder 51 which engages block 44 at 53 when in its extended position and also therefore allows the spring to be placed under a predetermined compression. In plan view as shown in FIGURE 9, the spring 45 has its connecting portion 49 accommodated in a slot 50. This slot prevents accidental sideway deflection of portion 49 in the plane of the face 52 of block 44. An in-line arrangement is shown in FIGURE 10 for a block 55 in which the connecting portions 49 protrude from the upper face 56 of the block. The film substrate can be clamped to the blocks concerned by spring clips in a manner similar to that described for FIGURE 2. The cantilever spring 45 may also be arranged in an "upright" position as in the embodiments of springs described above so that it behaves as an end loaded Euler strut. Such a mounted spring 70 is exemplified in FIGURE 12 within a block 71 and affixed to board 72.

Figure 11:
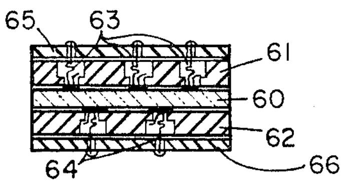
FIGURE 11 is a sectional view of a multiple assembly of connector blocks.

While the description so far has been of thin-film circuits in which only one side of the substrate contains deposited material, it is quite possible to make connections to both sides of a substrate in which both parts are used and such an example is shown in FIGURE 11. A substrate 60 is sandwiched between a block 61 and a block 62 each accommodating spring contacts 63 and 64 respectively. The circuit boards 65 and 66 associated with these spring members are also shown.

In one embodiment of the invention for a thin-film circuit using an ⅛" thickness glass substrate. The spring contacts were made of beryllium copper wire of .010 inch diameter. The force exerted by each hairpin on its associated gold contact was approximately 10–30 grams with a .01–.03 inch displacement. In general 30 groms would be the maximum force that would be required and finer wire than .010 inch may be used. One advantage of the invention is that the contacts may be arranged in any pattern which is convenient and may connect with the thin-film substrate at any point on its surface. Further since the connections are made directly rather than by sliding contact there is no tendency for the gold to be wiped off the substrate with consequent incorrect function. The distance through which the contact is displaced by the substrate is accurately controlled and thus the contact pressure is determined within accurate limits, since the spring can be precompressed a chosen amount.

I claim:

1. Apparatus for establishing connection to a thin-film circuit including a substrate and a thin conductive film deposited on said substrate, said film including an area to which contact is to be made, comprising; an electrically insulating block, said block defining a recess therein and a surface for reception of said thin-film substrate, said block defining an orifice in said surface adjacent said area and connecting with said recess, a spring member in said recess having a portion thereof projecting through said orifice in the absence of said substrate for a predetermined distance, a terminal board for mounting said block means attaching said block to said board and fastening means carried on said board for the end of said spring opposite to that of its projecting portion, said spring being precompressed in said recess and fastened by said fastening means, said projecting portion contacting said area of said substrate upon reception of said substrate by said block, said spring being thereby compressed through said predetermined distance and exerting a predetermined contact pressure against said thin-film circuit area.

2. Apparatus as defined in claim 1 comprising locating means on said spring adjacent said projecting portion for determining the furthest extent of projection of said projecting portion beyond said block surface, and providing a stop for allowing said precompression of said spring in said recess by predetermined positioning of said upper end of said spring with respect to said fastening means.

3. Apparatus as defined in claim 2 including further locating means adjacent said opposite end of said spring.

4. Apparatus as defined in claim 3 said further locating means comprising a knee on said spring.

5. Apparatus as defined in claim 2, said locating means adjacent said projecting portion comprising a shoulder on said spring.

6. Apparatus as defined in claim 1 wherein said orifice receives its spring projecting portion for longitudinal movement perpendicular to the substrate receiving surface of said block, while substantially preventing movement of said spring projection in the plane of said substrate receiving surface.

7. Apparatus as defined in claim 1 wherein said projecting portion is hairpin shaped, the apex of said hairpin forming a contact member for said thin-film circuit.

8. Apparatus as defined in claim 1, said spring being helically wound.

9. Apparatus as defined in claim 1, said spring being of cantilever shape.

References Cited by the Examiner

UNITED STATES PATENTS

| | | | |
|---|---|---|---|
| 2,592,601 | 4/1952 | Raymond et al. | 117—54 |
| 2,792,803 | 5/1957 | Hardesty | 339—17 X |
| 3,209,308 | 9/1965 | Aquillon | 339—17 X |

EDWARD C. ALLEN, *Primary Examiner.*

ALFRED S. TRASK, *Examiner.*